United States Patent
Vitzilaios et al.

(10) Patent No.: US 7,554,397 B2
(45) Date of Patent: Jun. 30, 2009

(54) HIGHLY LINEAR LOW-NOISE AMPLIFIERS

(75) Inventors: Georgios Vitzilaios, Galatsi (GR); Yannis Papananos, Vrilissia (GR)

(73) Assignee: Theta Microelectronics, Inc., Los Altos, CA (US)

( * ) Notice: Subject to any disclaimer, the term of this patent is extended or adjusted under 35 U.S.C. 154(b) by 76 days.

(21) Appl. No.: 11/801,945

(22) Filed: May 10, 2007

(65) Prior Publication Data

US 2007/0285162 A1    Dec. 13, 2007

Related U.S. Application Data

(60) Provisional application No. 60/802,106, filed on May 22, 2006.

(51) Int. Cl.
*H03F 1/26* (2006.01)
(52) U.S. Cl. .................................. 330/149; 455/114.3
(58) Field of Classification Search ................. 330/149, 330/79; 455/114.3
See application file for complete search history.

(56) References Cited

U.S. PATENT DOCUMENTS

| | | | |
|---|---|---|---|
| 6,259,325 B1 | 7/2001 | Ishizuka et al. | |
| 6,681,103 B1 | 1/2004 | Rogers et al. | |
| 6,724,253 B2 * | 4/2004 | Hau et al. | 330/149 |
| 6,809,581 B2 | 10/2004 | Rofougaran et al. | |
| 7,110,742 B2 | 9/2006 | Roufoogaran | |
| 7,167,044 B2 | 1/2007 | Li et al. | |
| 7,205,844 B2 | 4/2007 | Su et al. | |
| 7,339,436 B2 | 3/2008 | Fu et al. | |
| 7,355,479 B2 | 4/2008 | Van Der Heijden | |
| 2006/0281426 A1 | 12/2006 | Galan | |

OTHER PUBLICATIONS

Min-Gun Kim et al., "An FET-Level Linearization Method Using a Predistortion Branch FET", IEEE Microwave and Guided Wave Letters, Jun. 1999, pp. 233-235, vol. 9, No. 6.
David J. Cassan et al., "A 1-V Transformer-Feedback Low-Noise Amplifier for 5-GHz Wireless LAN in 0.18-μm CMOS", IEEE Journal of Solid-State Circuits, Mar. 2003, pp. 427-435, vol. 38, No. 3.
Ram Sadhwani et al., "Adaptive CMOS Predistortion Linearizer for Fiber-Optic Links", Journal of Lightware Technology, Dec. 2003, pp. 3180-3193, vol. 21, No. 12.
Vladimir Aparin et al., "Linearization of CMOS LNA's Via Optimum Gate Biasing", IEEE ISCAS 2004, pp. IV-748-IV-751.

(Continued)

*Primary Examiner*—Robert Pascal
*Assistant Examiner*—Hieu P Nguyen
(74) *Attorney, Agent, or Firm*—Blakely Sokoloff Taylor & Zafman LLP

(57) ABSTRACT

A predistortion method for CMOS Low-Noise-Amplifiers (LNAs) to be used in Broadband Wireless applications is presented. The method is based on the nulling of the third order Intermodulation distortion (IMD3) of the main amplifier by a highly nonlinear predistortion branch. Maximum third order product cancellation is ensured by a transformer feedback method. The technique improves linearity in a wide range of input power without significant gain and Noise Figure (NF) degradation. Simulation results on a 1-V LNA indicate a 10.3 dB improvement in the Input Third-Order Intercept Point (IIP3) with a reduction of only 1 dB and 0.44 dB in amplifier gain and NF respectively.

25 Claims, 5 Drawing Sheets

OTHER PUBLICATIONS

Tae Wook Kim et al., "Highly Linear Receiver Front-End Adopting MOSFET Transconductance Linearization by Multiple Gated Transistors", IEEE Journal of Solid-State Circuits, Jan. 2004, pp. 223-229, vol. 39, No. 1.

Vladimir Aparin et al., "Modified Derivative Superposition Method for Linearizing FET Low-Noise Amplifiers", IEEE Transactions on Microwave Theory and Techniques, Feb. 2005, pp. 571-581, vol. 53, No. 2.

* cited by examiner

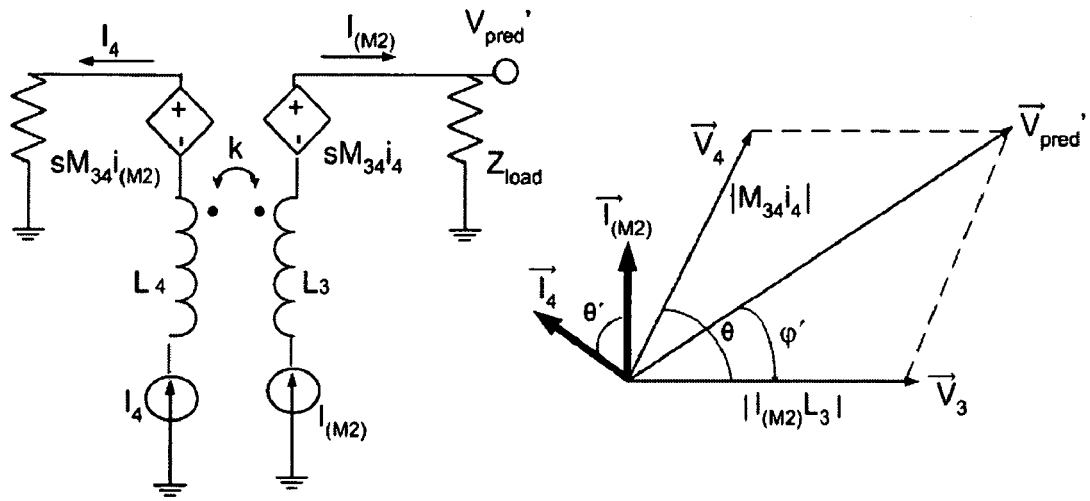

FIG. 6A  FIG. 6B

| LNA PERFORMANCE SUMMARY | | |
|---|---|---|
| Parameter | Without Predistortion | Proposed Topology |
| Frequency | 5GHz | 5GHz |
| LNA Gain (S21) | 11.6dB | 10.6dB |
| Coupling Coefficient (k) | - | 0.8 |
| Noise Figure | 1.15dB | 1.59dB |
| IIP3 | +9.4dB | +19.7dB |
| Input Power Range (IIP3=constant) | -28dBm--14dBm | -26dBm--17dBm |
| Improved IIP3 sensitivity ($L_3, L_4 \pm 20\%$) | - | +17.8dB–18.5dB |
| Improved IIP3 sensitivity ($k \pm 20\%$) | - | +18.6dB–19.6dB |
| 3dB Bandwidth | 1.49Ghz | 1.6GHz |
| Reverse Isolation (S12) | 19.1dB | 20.1dB |
| Supply Voltage | 1V | 1V |
| Power Dissipation | 15.3mW | 15.4mW |
| Predistortion stage current consumption | - | 0.110mA |
| Technology | CMOS 0.13um | CMOS 0.13um |

HIGHLY LINEAR LOW-NOISE AMPLIFIERS

CROSS-REFERENCE TO RELATED APPLICATION

This application claims the benefit of U.S. Provisional Patent Application Ser. No. 60/802,106 filed May 22, 2006.

BACKGROUND OF THE INVENTION

1. Field of the Invention

The invention relates generally to low-noise amplifiers and more specifically to low-noise amplifiers having predistortion circuitry.

2. Prior Art

Highly linear circuits are of paramount importance in RF systems, as nonlinearity causes many problems, including, among others, harmonic generation, gain compression, desensitization, blocking, cross modulation and intermodulation. Several linearization techniques have been introduced, especially in Power Amplifier (PA) design. However, despite their explicit improvement in linearity, their complex structure (usually based on sophisticated feedback schemes), does not allow them to be used in LNA designs where low noise requirements are of prime importance.

An elegant LNA linearization technique is the derivative superposition method. The CMOS implementation of the technique is effective at relatively low frequencies due to the large transistors required, whereas in a BiCMOS technology, the technique might be used at higher frequencies. An alternative method of predistortion using the technique of adaptive gate biasing is proposed for a 900 MHz LNA design. Unfortunately, the method is limited to operation frequencies below 2 GHz due to speed problems at higher frequencies. A shunt FET predistortion branch can be used for PA linearization. In such a design, the $3^{rd}$-order derivative of the predistortion branch transfer function is used to partially cancel the third-order intermodulation distortion (IMD3) response generated by the main amplifier. A significant improvement in the third order input intercept point (IIP3) value is observed, at the expense of reduced gain in the passband. In addition, phase delay problems at high frequencies negate the linearization effect, limiting the applicability of the topology.

A single, shunt transistor predisorter (STP) 120 is shown with respect to a prior art linearized low noise amplifier 100, shown in FIG. 1. The main amplifier is a 1-V LNA 110 design. The drain current $i_d$ can be characterized by a Taylor series expansion of the gate voltage around the bias point. The output current is approximated by:

$$i_d(v_g) = \left.\frac{dI_d}{dV_g}\right|_{V_g=V_G} v_g + \frac{1}{2}\left.\frac{d^2 I_d}{dV_g^2}\right|_{V_g=V_G} v_g^2 + \frac{1}{6}\left.\frac{d^3 I_d}{dV_g^3}\right|_{V_g=V_G} v_g^3 = \quad (1)$$
$$g_m^{(1)} v_g + g_m^{(2)} v_g^2 + g_m^{(3)} v_g^3$$

$I_d$ and $V_g$ are the large signal drain current and gate voltage, $v_g$ and $i_d$ are incremental gate-voltage and drain-current respectively around the quiescent bias point ($I_D$, $V_G$) and $g_m^{(n)}$ indicates the $n^{th}$ order derivative of $I_d$ with respect to $V_g$. Under appropriate biasing, $M_2$ is used to generate the opposite polarity IMD3 signal with respect to that of $M_1$, and is utilized for LNA linearization by IMD3 product cancellation.

The topology achieves a large increase in linearity performance with a significant decrease in power gain (~1.78 dB). The topology suffers severely from phase delay problems at high frequencies, and this negates the linearization effect. Finally, the linearization depends on the $g_m^{(3)}$ value, which is degraded severely around the optimum bias point, leading to linearity degradation. It would therefore be advantageous to provide predistortion circuitry that would overcome the shortcomings of the prior art.

BRIEF DESCRIPTION OF THE DRAWINGS

FIG. 6 is an exemplary and simplified version of the predistortion procedure when the transformer is in place.

FIG. 7 is a table summarizing the performance of the LNA with and without predistortion in accordance with the disclosed invention.

DETAILED DESCRIPTION OF THE PREFERRED EMBODIMENTS

A predistortion method for CMOS Low-Noise-Amplifiers (LNAS) to be used in Broadband Wireless applications is presented. The method is based on the nulling of the third order Intermodulation distortion (IMD3) of the main amplifier by a highly nonlinear predistortion branch. Maximum third order product cancellation is ensured by a transformer feedback method. The technique improves linearity in a wide range of input power without significant gain and Noise Figure (NF) degradation. Simulation results on a 1-V LNA indicate a 10.3 dB improvement in the Input Third-Order Intercept Point (IIP3) with a reduction of only 1 dB and 0.44 dB in amplifier gain and NF, respectively.

The technique disclosed herein utilizes the $3^{rd}$ order derivative of the highly non-linear, combined transfer function of a three-transistor network predistortion branch, for partial cancellation of the IMD3 of the main amplifier. In addition, a magnetic feedback method is used to achieve maximum linearity for a wide range of input power values. The technique aligns the predistortion signal vector with the IMD3 signal vector generated by the main amplifier, leading to vector cancellation and optimum linearity performance. Furthermore, magnetic feedback is used to shift the "sweet spot" position introduced by the predistortion branch in order to ensure linearity improvement for a wide range of input power values. The technique improves linearity without significant gain and NF reduction, while both the predistortion signal phase and the "sweet spot" position are electronically tunable.

Figure 1:
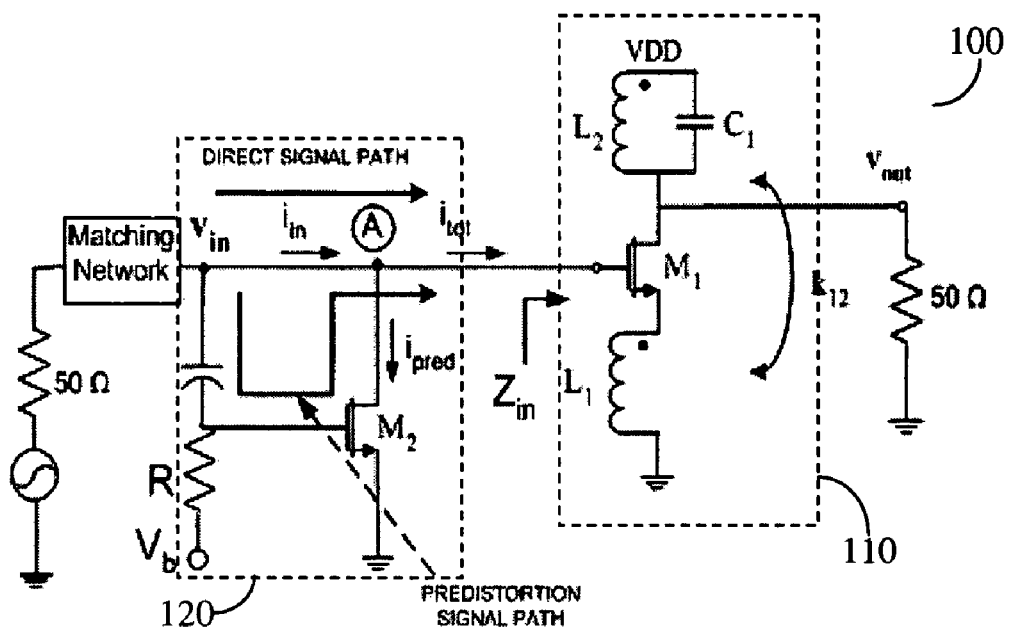
FIG. 1 is a linear LNA with a predistortion signal path (prior art).
Figure 2:
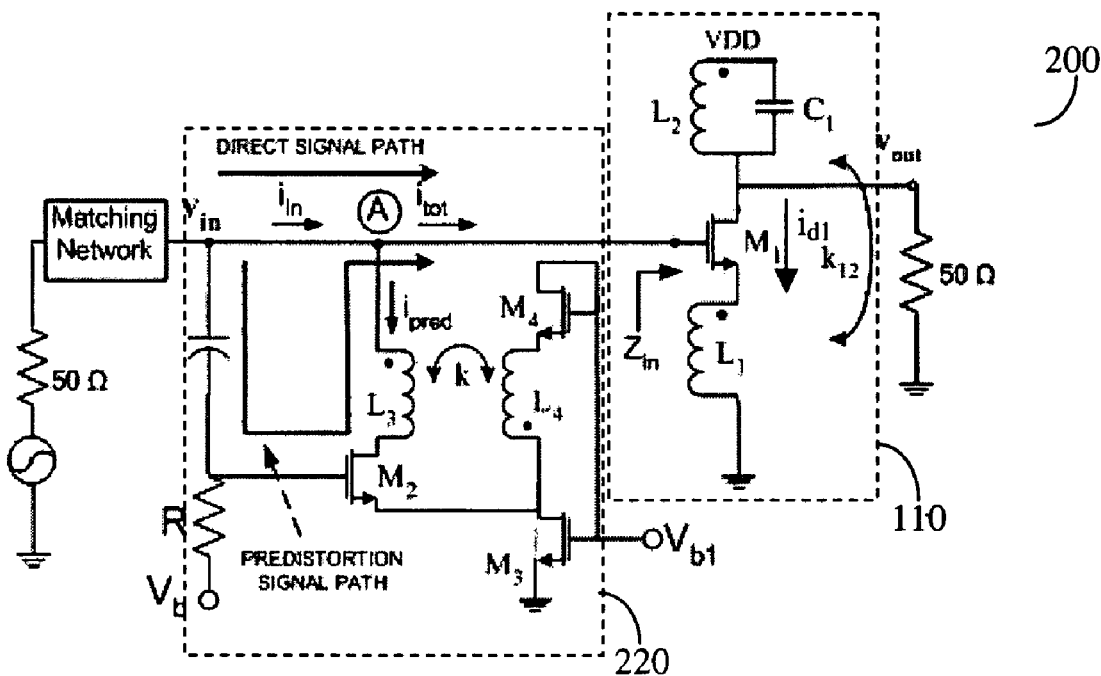
FIG. 2 is a highly linear LNA with magnetic coupling on the predistortion signal path.

The proposed, exemplary and non-limiting predistortion circuit 220 is presented in FIG. 2. The predistorter 220 consists of transistors $M_2$, $M_3$ and $M_4$. Transistor $M_4$ is biased near the subthreshold region by $V_{b1}$ and provides a highly non-linear load to transistor $M_3$. The output node of $M_3$ is connected to the source node of $M_2$, biased near the subthreshold region by $V_b$, degenerating the device. Neglecting for the moment the transformer comprising $L_3$ and $L_4$, a first order analysis is applicable to both the prior art and the predistorter 220 of the disclosed invention. Applying Kirchoff's Current Law (KCL) at node "A", shows that the total input current flowing towards the LNA 110 of the highly linear low noise amplifier (HLLNA) 200 is:

$$i_{tot} = i_{in} - i_{pred} \qquad (2)$$

where $i_{pred}$ is the drain current of $M_2$. Assuming that the value of resistor R is large, $v_{in}$ will appear at the gate terminal of $M_2$, and so $i_{pred}$ may be Taylor expanded to give:

$$i_{pred} = i_{d2}(v_{in}) = g_{m2}^{(1)} v_{in} + g_{m2}^{(2)} v_{in}^2 + g_{m2}^{(3)} v_{in}^3 \qquad (3)$$

The total output current ($i_{d1}$) of the LNA is found by adding the current contribution of the direct signal path and the contribution of the predistortion signal path. The direct signal path provides a current given by eq. (4).

$$i_{d1}(\text{direct\_path})(v_{in}) = g_{m1}^{(1)} v_{in} + g_{m1}^{(2)} v_{in}^2 + g_{m1}^{(3)} v_{in}^3 \qquad (4)$$

while the predistortion signal contribution is found by transforming the current signal to an equivalent voltage at the gate of $M_1$.

$$v_{pred} = i_{d2}(v_{in}) Z_{in} = (g_{m2}^{(1)} v_{in} + g_{m2}^{(2)} v_{in}^2 + g_{m2}^{(3)} v_{in}^3) Z_{in} \qquad (5)$$

$Z_{in}$ is the effective input impedance of the LNA 110. This signal is then amplified by $M_1$ to provide the output current contribution of the predistortion signal.

$$i_{d1}(\text{predistortion\_path})(v_{pred}) = g_{m1}^{(1)} v_{pred} + g_{m1}^{(2)} v_{pred}^2 + g_{m1}^{(3)} v_{pred}^3 \qquad (6)$$

Substituting (5) into (6) and adding (4), the transfer characteristic equation of the LNA 110 with predistortion is found. Analyzing the $1^{st}$ and $3^{rd}$ order product terms:

$$i_{d1} = (i_{d1(direct\_path)} + i_{d1(predistortion\_path)}) \qquad (7)$$
$$\approx g_{m1}^{(1)}(v_{in} - v_{pred}) + g_{m1}^{(3)}(v_{in}^3 - v_{pred}^3)$$
$$\approx (g_{m1}^{(1)} - g_{m1}^{(1)}(g_{m2}^{(1)} Z_{in})) v_{in} + (g_{m1}^{(3)} - g_{m1}^{(1)}(g_{m2}^{(3)} Z_{in})) v_{in}^3$$

Eq. (7) indicates that optimum performance will arise when:

$$(g_{m1}^{(1)}(g_{m2}^{(1)} Z_{in}(v_{in}))) \to 0 \Rightarrow g_{m2}^{(1)} \to 0 \qquad (a)$$

$$(g_{m1}^3 v_{in}^3 = g_{m1}^{(1)}(g_{m2}^{(3)} Z_{in}(v_{in})^3)) \qquad (b)$$

Figure 3:
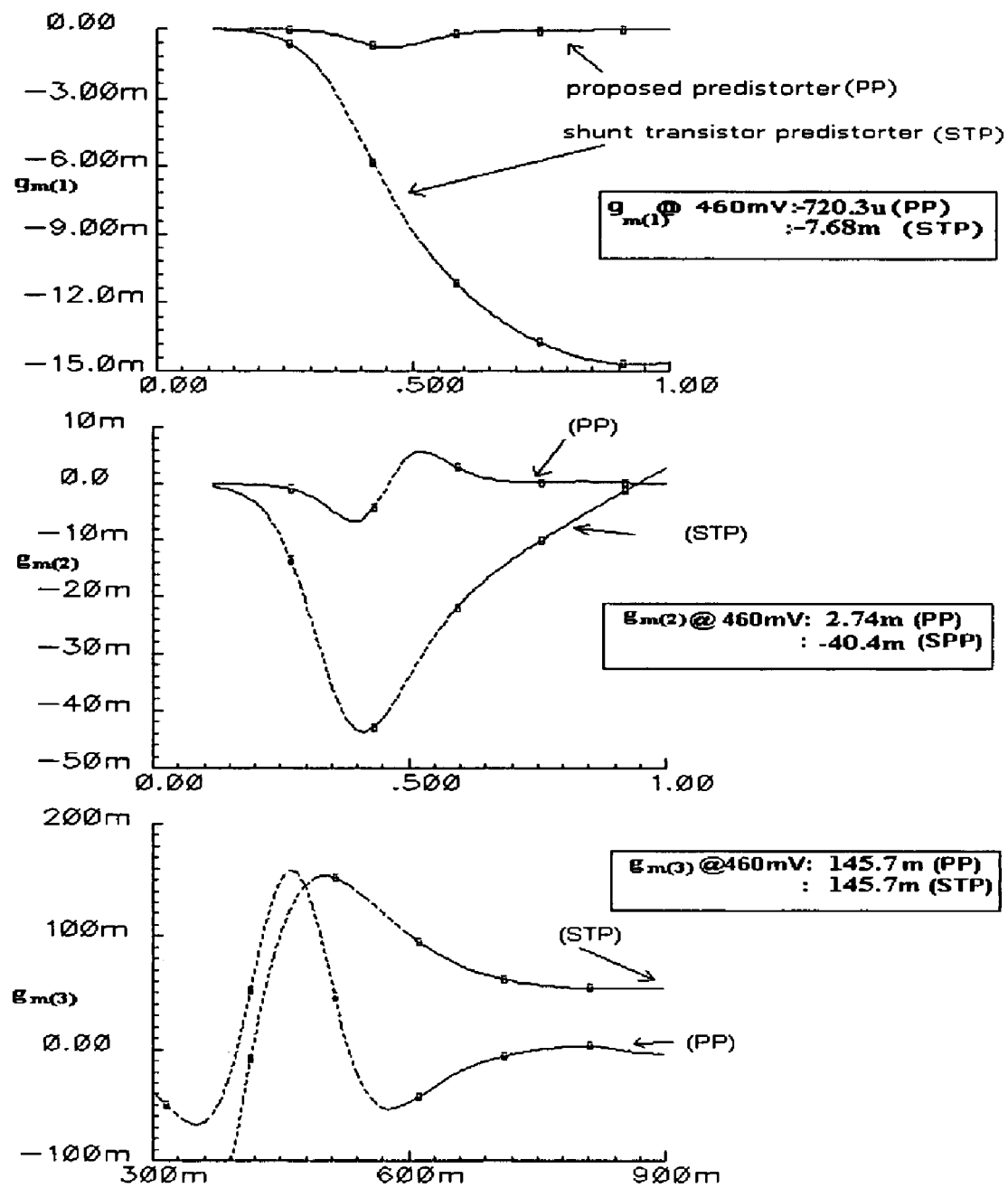
FIG. 3 shows the $1^{st}$, $2^{nd}$ and $3^{rd}$ order derivatives of the $M_2$ drain current of the STP and the highly linear LNA with magnetic coupling designed in accordance with the disclosed invention.

Under condition (a), minimum degradation on the amplifier gain and Noise Figure will be achieved, since the $1^{st}$ order signal of the predistortion branch that subtracts from the amplifier gain will tend to zero and so will be the current-dependent noise contribution of $M_2$. Under condition (b), maximum IMD3 cancellation will occur. In FIG. 3, the $1^{st}$, $2^{nd}$ and $3^{rd}$ order derivatives of the $M_2$ drain current of the two topologies with respect to the gate voltage of $M_2$ are compared. With the proposed topology disclosed in this invention, the $g_{m2}^{(1)}$ value is kept small (9% of the equivalent STP 120 value), while the $g_{m2}^{(3)}$ term is set equal in both cases. This indicates that the invention allows for $g_{m2}^{(1)}$ to be reduced by an order of magnitude compared to the prior art STP 120, in order to satisfy condition (a), while condition (b) is satisfied by the same amount by both topologies.

However, both topologies suffer from a serious limitation: At high frequencies, where the signal quantities must be treated as vectors that are subject to phase shifts, equation (2) must be rewritten in vector form:

$$\vec{I}_{tot} = \vec{I}_{in} - \vec{I}_{pred} \qquad (8)$$

When the relative phase of these vectors deviates from the ideal value of 0°, the predistorter effect is reduced and is negated for a phase difference of 90°. It is thus imperative to ensure appropriate phase difference between the vectors. In addition, the $M_2$ gate bias voltage in the proposed topology is increased with increasing input power due to the self-bias effect. This is because the initial biasing is near the subthreshold region. The self-biasing limits the linearization effect due to $g_{m2}^{(3)}$ degradation away from the optimum bias point, as shown in FIG. 3.

Figure 4:
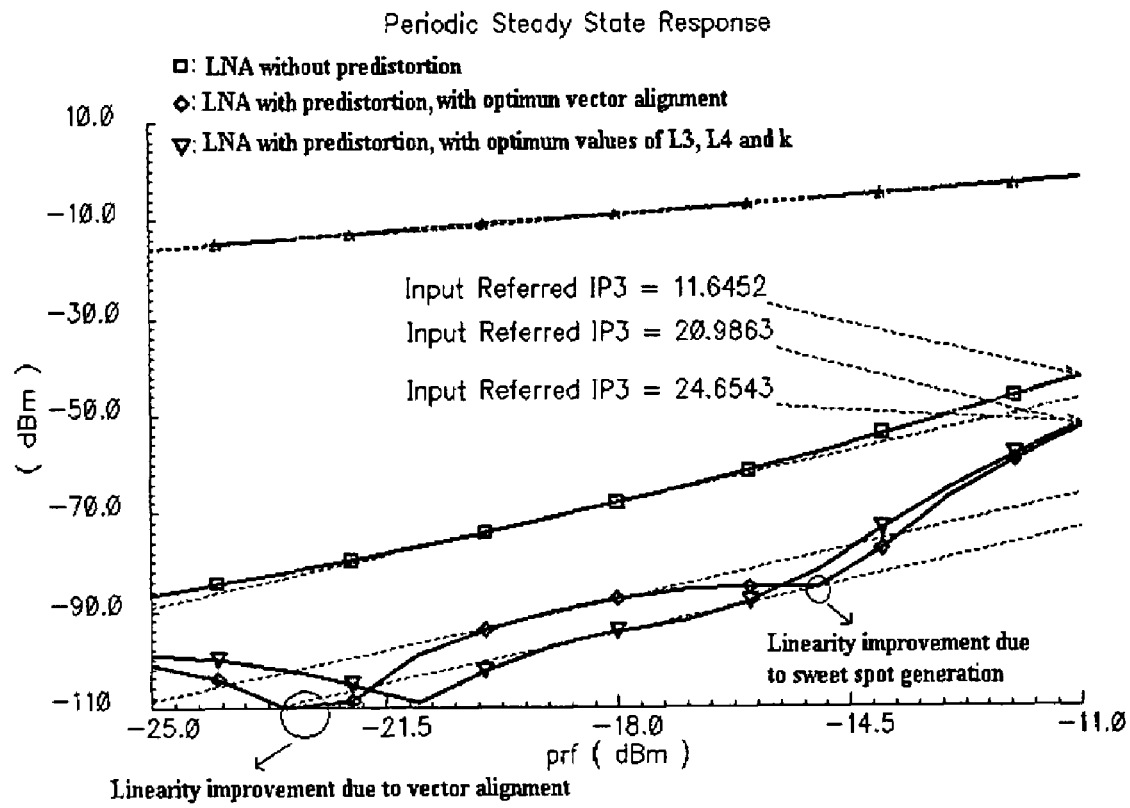
FIG. 4 shows the linearity improvement in a circuit designed in accordance with the disclosed invention.
Figure 5:
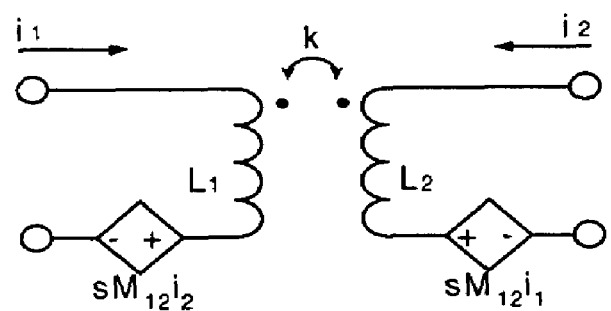
FIG. 5 is a transformer for magnetic feedback.

The solution for the above mentioned problems is addressed by the two techniques presented below: First, the predistorter 220 generates a "sweet spot", i.e. an improvement of the linearity performance in a narrow range of input power values due to a transistor gain expansion. This occurs for an input power of −14.6 dBm as shown in FIG. 4. In the disclosed invention, it is created by means of transistor $M_2$ gain compression, which is ensured to occur for low input power values due to the following effect; the feedback action from $M_4$ increases the output voltage at the drain node of $M_3$ in a fast rate when the input power is increased. This results in $M_2$ gain compression due to increased voltage at the source terminal. The gain compression of $M_2$ can be seen in the $g_{m2}^{(1)}$ graph in FIG. 3, and it occurs for a $M_2$ gate bias voltage around 510 mV. The main drawback is that the sweet spot improves the linearity of the topology for only a narrow range of input power. The sweet spot position may be changed by the transformer consisting of inductors $L_3$ and $L_4$. Transformers can be used to provide magnetic feedback which is modeled as shown in FIG. 5. The nature of the feedback depends on the direction of the currents $I_1$ and $I_2$. In this notation, M is the mutual inductance and is equal to $M = k\sqrt{L_1 L_2}$, where k is the coupling coefficient. The transformer feedback in inductor $L_4$ is used to increase the voltage at the source of $M_2$ at an even faster rate, leading to the gain compression of $M_2$ for lower input power values, and therefore moving the sweet spot to a designer-defined power level.

Figure 9:
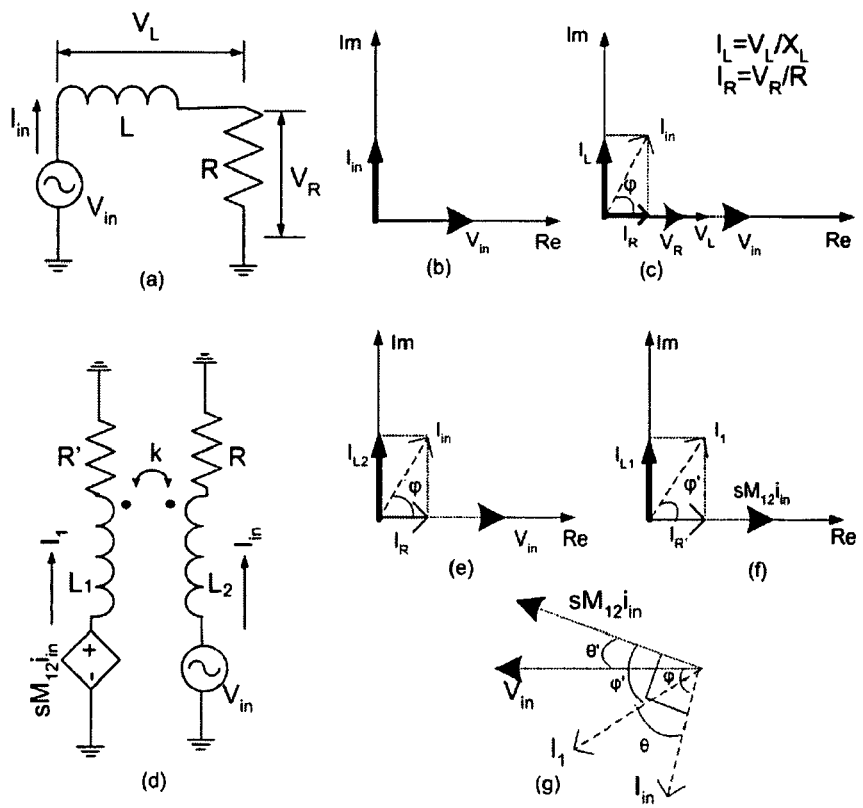
FIG. 9 includes diagrams for vector analysis of the circuits designed in accordance with the disclosed invention.

The second technique relies on the fact that the transformer may be used for manipulating the relative angle between the vectors in equation 8, in order to ensure maximum linearity by vector cancellation. In integrated transformers, and as further discussed herein below, the in-band phase difference between the currents and between the induced voltages in the primary and secondary inductors of a transformer deviates by a significant amount from the ideal 0° difference, in the case of positive feedback. This imperfection is used in the proposed method to the designer's advantage. FIG. 9(*a*) represents the application of a signal to a loaded integrated inductor. In FIG. 9(*b*) the situation where the inductor value is large is depicted. If $X_L >> R$, then the current and voltage vectors are orthogonal. In integrated inductors, where the inductance values are limited in the nH range, the real part of the load (R) cannot be neglected. The corresponding signals are depicted in FIG. 9(*c*). It is obvious that there is a phase shift of the current vector, indicated by the angle $\phi$, due to the fact that the value of $X_R$ becomes comparable to $X_L$. In FIG. 9(*d*) the application of a signal to an integrated transformer is shown. The current and voltage vectors in the $L_2$ branch are depicted in FIG. 9(*e*). As stated above, there is a finite angle $\phi$ between the vectors. The input signal is induced in the $L_1$ branch through the current dependent voltage source, $sM_{1,2} i_{in}$, providing a voltage orthogonal to $I_{in}$. The non zero value of R' in FIG. 9(d) will result in a phase difference φ' between $sM_{12}i_{in}$ and the resulting current $i_1$ as shown in FIG. 9(f). The current and voltage vectors are placed together under the appropriate phase relations in the same graph as shown in FIG. 9g. It is evident that there is a deviation from the ideal case of the ideal 0° phase difference by θ and θ' in the voltage and current vectors respectively. The value of the coupling coefficient ($M=k\sqrt{L_1L_2}$) only affects the $sM_{12}i_{in}$ magnitude, and changing its value will not affect the values of θ and θ'.

FIG. 6 represents a simplified version of the predistortion procedure when the transformer is in place. The current source $I^{(M2)}$ represents the predistortion current at the drain source of $M_2$, while $Z_{load}$ represents the load the main amplifier presents to $M_2$. $V_{pred}'$ is the modified predistortion signal at the gate terminal of $M_1$ and $I_4$ is the non-linear current flowing in inductor $L_4$. When the inductors are coupled (FIG. 6(a)), the corresponding vectors are shown in FIG. 6(b). The phase difference between $I_{(M2)}$ and $I_4$ is represented by the angle θ' and between the induced voltages $V_3$ and $V_4$ by the angle θ. Both angles are exaggerated for demonstration purposes. Angles θ' and θ are constant, being different from 0°, and determined by the values of $L_3$ and $L_4$, are not a function of the transformer coupling coefficient. It should be noted that $V_3$ represents the predistortion signal $V_{pred}$ when the coupling coefficient is zero. In order to find the modified predistortion signal $V_{pred}'$, the vector summation of the voltages $V_3$ and $V_4$ of FIG. 6(b) must be performed to give:

$$\vec{V}_{pred'} = (j\omega L_3)\vec{I}_{(M_2)} + (j\omega M_{34})\vec{I}_4 \quad (9)$$
$$= (j\omega L_3)\vec{I}_{(M_2)} + (j\omega k\sqrt{L_3 L_4})\vec{I}_4$$

The vector magnitude and phase of $\vec{V}_{pred'}$ are given in equations (10) and (11) respectively.

$$\mathrm{mag}V_{pred'} = \sqrt{[|i_{(M_2)}L_3| + |i_4 M_{34}|\cos\theta]^2 + [|i_4 M_{34}|\sin\theta]^2} \quad (10)$$

$$\mathrm{phase}V_{pred'} = \phi = \arctan\left(\frac{[|i_4 M_{34}|\sin\theta]}{[|i_{(M_2)}L_3| + |i_4 M_{34}|\cos\theta]}\right) \quad (11)$$

This vector is thus phase shifted by an angle φ with respect to the case where there is no coupling, (represented by vector $V_3$). This angle is controllable by manipulating the vector $V_4$, either through the value of k or by changing $i_4$, as is evident from equation (9).

This indicates that the designer can shift the initial phase angle of the predisorter signal in order for condition (b) to be satisfied. This is represented in FIG. 3, where vector alignment provides the local minimum in $3^{rd}$ order product response for an input power of −23 dBm. The linearity response is optimized by bringing this minimum and the sweet spot closer together, making the linearity improvement range wider and centering it at the desired range of input power values. The optimization procedure is represented graphically in FIG. 4. In this figure, the two distinct areas of linearity improvement due to vector cancellation and sweet spot creation are indicated, when the sweet spot position is not optimized. When the transformer is used to move the sweet spot position at lower frequencies, it is evident that the input power range where linearity improvement occurs may be maximized. Since the coupling coefficient value is restricted by the amount of feedback required for bringing the two minima close, the values of $L_3$ and $L_4$ must be chosen such that the initial angle θ brings the shifted vector in the vicinity of maximum cancellation. The predistortion branch may be electronically tuned by a voltage, by manipulation of the current $i_4$. The phase shifting procedure is not independent of the "sweet spot" position shifting, so it is necessary to include two electronically controlled biases as shown in FIG. 2. This allows for maximum linearity to be achieved simultaneously by both optimum phase difference and sweet spot position.

In summary, the design principle of the disclosed predistorter relies on three factors. First, a highly non-linear predistortion branch is used, which provides an adequate $g_{m2}^{(3)}$ term, while the $g_{m2}^{(1)}$ term is small, avoiding gain reduction and NF deterioration. Second, the transformer based method guarantees maximum efficiency by ensuring vector cancellation through vector alignment. Finally, the predistortion branch introduces a sweet spot, the position of which is changed by the transformer in order to achieve maximum linearity in a wide range of input power values. The use of two control voltages ensures linearity improvement under component parameter deviations, especially in the inductance values. This is done by choosing, using the bias voltages, the relative weight each linearity improvement factor contributes to the overall linearity performance depending on the fabricated circuit.

Figure 8:
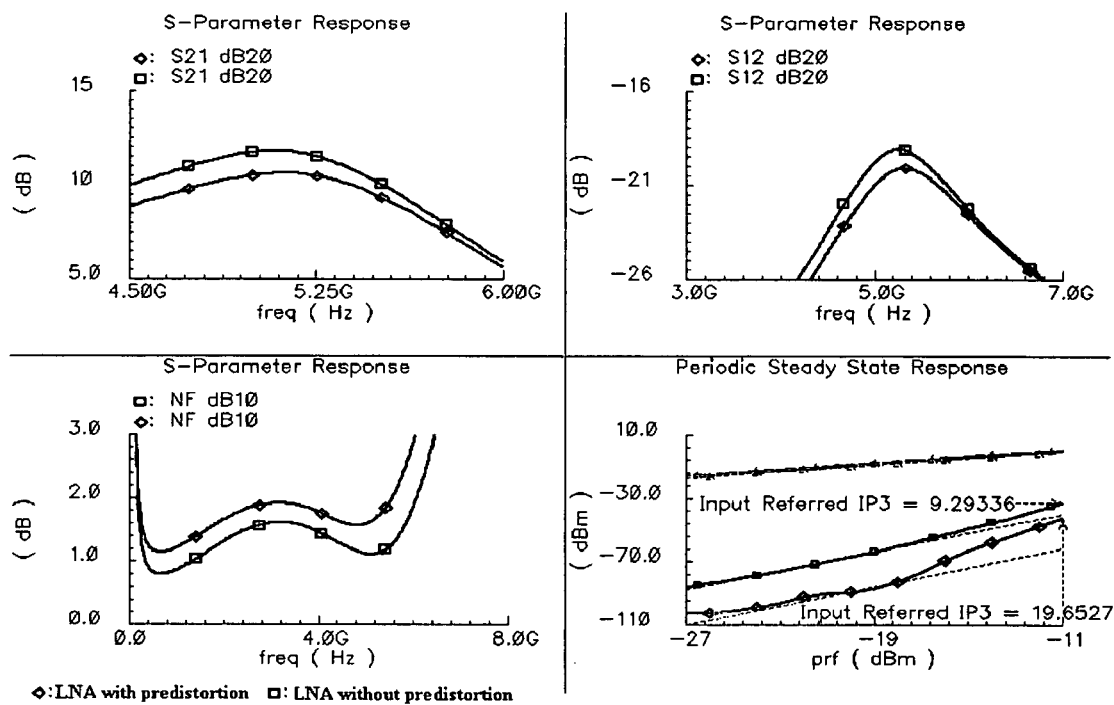
FIG. 8 is an example of a comparison simulation of the power gain response ($S_{21}$), the reverse isolation ($S_{12}$), the Noise Figure (NF) and the IIP3 performance.

A comparison study of the LNA without predistortion and the proposed design was made using device files from a 0.13-um CMOS technology. A set of typical package parasitics of a QFN package was used and the transformer parameters were extracted using EM software. All simulation results refer to conjugate matched designs to a 50Ω input, loaded by a typical 50Ω load. The main amplifier was kept the same in all cases and only minor modifications in the matching networks were made when the different predistorters were used. FIG. 8 illustrates a comparison simulation of the power gain response ($S_{21}$), the reverse isolation ($S_{12}$), the NF and the $IIP_3$ performance of the topologies. The operation frequency was set at 5 GHz. Simulation results show a 1 dB gain loss and 0.44 dB NF deterioration of the proposed topology 200 compared to the LNA without predistortion, which are attributed to the non-zero $g_{m2}^{(1)}$ value of the topology. The reverse isolation performance is 1 dB better and the $IIP_3$ value is increased by 10.3 dB for a range of −26 dBm- −17 dBm of input power. The overall performance of the circuits is summarized in FIG. 7.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A highly linear low noise amplifier (HLLNA) comprising:
   a low noise amplifier stage; and
   a predistortion circuit coupled to the input of said low noise amplifier stage, said predistortion circuit having a first control signal and a second control signal, each of said first control signal and said second control signal adapted to cause a respective MOS transistor to operate near the subthreshold region;
   said predistortion circuit enabled to utilize a third order derivative of a highly non-linear transfer function of said predistortion circuit for at least partial cancellation of the third order intermodulation distortion (IMD3) of the low noise amplifier stage;

wherein said predistortion circuit further comprises a magnetic feedback enabled to achieve maximum linearity for a wide range of input power values.

2. The HLLNA of claim 1, wherein said maximum linearity for a wide range of input power values is achieved by shifting said predistortion circuit sweet spot by means of said first control signal and/or said second control signal.

3. The HLLNA of claim 1, wherein the said first control signal and said second control signal enable maximum linearity by providing optimum phase difference and a sweet spot operation point.

4. A highly linear low noise amplifier (HLLNA) comprising:
a low noise amplifier stage; and
a predistortion circuit coupled to the input of said low noise amplifier stage, said predistortion circuit having a first control signal and a second control signal, each of said first control signal and said second control signal adapted to cause a respective MOS transistor to operate near the subthreshold region;
said predistortion circuit enabled to utilize a third order derivative of a highly non-linear transfer function of said predistortion circuit for at least partial cancellation of the third order intermodulation distortion (IMD3) of the low noise amplifier stage;
wherein said predistortion circuit comprises:
a first transistor, the gate of which is coupled to the input of the HLLNA, and the bias of which is controlled by said first control signal;
a second transistor the drain of which is coupled to said first transistor and the bias of which is controlled by said second control signal;
a first inductor coupled to the drain of said first transistor and to the input of the HLLNA;
a second inductor magnetically coupled to said first inductor, and further coupled to the drain of said second transistor; and
a third transistor coupled to said second inductor and connected as a drain follower, the gate of which is coupled to said second control signal.

5. The HLLNA of claim 4, wherein said first inductor and said second inductor form a transformer.

6. The HLLNA of claim 4, wherein said third transistor is a highly non-linear load to said second transistor.

7. The HLLNA of claim 4, wherein the gain compression of said first transistor is responsive of the feedback action from said third transistor such that the power of the output voltage at the drain node of said second transistor increases at a fast rate.

8. A highly linear low noise amplifier (HLLNA) comprising:
a low noise amplifier;
a predistorter coupled to the input of said low noise amplifier and enabled by: a) sufficient third order term transconductance and a small first order term transconductance; b) a magnetic coupling between two inductors to provide maximum efficiency by ensuring vector cancellation through vector alignment; and, c) a sweet spot, the position of which is changed by said two inductors in order to achieve maximum linearity in a wide range of input power values.

9. The HLLNA of claim 8, wherein said predistorter comprises:
a first control signal and a second control signal, each of said first control signal and said second control signal being adapted to cause a respective MOS transistor to operate near the subthreshold region;
said predistorter enabled to utilize a third order derivative of a highly non-linear transfer function of said predistorter for at least partial cancellation of the third order intermodulation distortion (IMD3).

10. The HLLNA of claim 9, wherein said predistorter further comprises a magnetic feedback enabled to achieve maximum linearity for a wide range of input power values.

11. The HLLNA of claim 10, wherein said maximum linearity for a wide range of input power values is achieved by shifting said predistorter sweet spot by means of said first control signal and/or said second control signal.

12. The HLLNA of claim 9, wherein said predistorter comprises:
a first transistor the gate of which is coupled to the input of the HLLNA, and the bias of which is controlled by said first control signal;
a second transistor the drain of which is coupled to said first transistor and the bias of which is controlled by said second control signal;
a first inductor coupled to the drain of said first transistor and to the input of the HLLNA;
a second inductor magnetically coupled to said first inductor, and further coupled to the drain of said second transistor; and
a third transistor coupled to said second inductor and connected as a drain follower, the gate of which being coupled to said second control signal.

13. The HLLNA of claim 12, wherein said first inductor and said second inductor form a transformer.

14. The HLLNA of claim 12, wherein said third transistor is a highly non-linear load to said second transistor.

15. The HLLNA of claim 12, wherein the gain compression of said first transistor is responsive of the feedback action from said third transistor such that the power of the output voltage at the drain node of said second transistor increases at a fast rate.

16. The HLLNA of claim 9, wherein the said first control signal and said second control signal enable maximum linearity by providing optimum phase difference and a sweet spot operation point.

17. A predistorter comprising:
a first control signal and a second control signal, each of said first control signal and said second control signal being adapted to cause a respective MOS transistor to operate near the subthreshold region; and
a magnetic feedback enabled to achieve maximum linearity for a wide range of input power values;
the predistorter enabled to utilize a third order derivative of a highly non-linear transfer function of the predistorter for at least partial cancellation of the third order intermodulation distortion (IMD3) when coupled to the input of a low noise amplifier.

18. The predistorter of claim 17, wherein said maximum linearity for a wide range of input power values is achieved by shifting the predistorter's sweet spot by means of said first control signal and/or said second control signal.

19. The predistorter of claim 17, wherein the said first control signal and said second control signal enables maximum linearity by providing optimum phase difference and a sweet spot operation point.

20. A predistorter comprising:
a first control signal and a second control signal, each of said first control signal and said second control signal being adapted to cause a respective MOS transistor to operate near the subthreshold region;
the predistorter enabled to utilize a third order derivative of a highly non-linear transfer function of the predistorter for at least partial cancellation of the third order intermodulation distortion (IMD3) when coupled to the input of a low noise am amplifier, the predistorter further comprising:

a first transistor, the gate of which is coupled to an input signal, and the bias of which is controlled by said first control signal;

a second transistor the drain of which is coupled to said first transistor and the bias of which is controlled by said second control signal;

a first inductor coupled to the drain of said first transistor and to said input;

a second inductor magnetically coupled to said first inductor, and further coupled to the drain of said second transistor; and a third transistor coupled to said second inductor and connected as a drain follower, the gate of which being coupled to said second control signal.

21. The predistorter of claim 20, wherein said first inductor and said second inductor form a transformer.

22. The predistorter of claim 20, wherein said third transistor is a highly non-linear load to said second transistor.

23. The predistorter of claim 20, wherein the gain compression of said first transistor is responsive of the feedback action from said third transistor such that the power of the output voltage at the drain node of said second transistor increases at a fast rate.

24. A method for designing a predistorter comprising:

providing a predistortion branch coupled to the input signal that provides adequate third order term transconductance and low first order term transconductance;

ensuring that a transformer comprised of a first inductor magnetically coupled to a second inductor provides maximum efficiency by vector cancellation through vector alignment; and, introducing a sweet spot by the predistortion branch which is changeable by said transformer in order to achieve maximum linearity for a wide range of input power values.

25. The method of claim 24 further comprising:

using two bias voltages to determine the relative weight of each linearity improvement contributed by each component.

* * * * *